US010453986B2

(12) United States Patent
Riva

(10) Patent No.: US 10,453,986 B2
(45) Date of Patent: Oct. 22, 2019

(54) PROCESS FOR THE MANUFACTURE OF SOLAR CELLS

(75) Inventor: Marcello Riva, Hannover (DE)

(73) Assignee: SOLVAY FLUOR GMBH, Hannover (DE)

( * ) Notice: Subject to any disclaimer, the term of this patent is extended or adjusted under 35 U.S.C. 154(b) by 511 days.

(21) Appl. No.: 12/863,355

(22) PCT Filed: Apr. 28, 2008

(86) PCT No.: PCT/EP2008/055173
§ 371 (c)(1),
(2), (4) Date: Jul. 16, 2010

(87) PCT Pub. No.: WO2009/092453
PCT Pub. Date: Jul. 30, 2009

(65) Prior Publication Data
US 2010/0288330 A1 Nov. 18, 2010

Related U.S. Application Data

(60) Provisional application No. 61/022,958, filed on Jan. 23, 2008.

(51) Int. Cl.
H01L 31/0264 (2006.01)
H01L 31/18 (2006.01)
H01L 27/12 (2006.01)
H01L 31/0236 (2006.01)

(52) U.S. Cl.
CPC .......... H01L 31/18 (2013.01); H01L 27/1214 (2013.01); H01L 31/02363 (2013.01); H01L 31/1804 (2013.01); Y02E 10/547 (2013.01); Y02P 70/521 (2015.11)

(58) Field of Classification Search
CPC ... H01L 25/042–047; H01L 31/02008–02021; H01L 31/02167–022441; H01L 31/042; H01L 31/0516; H01L 31/068–06875; H01L 31/076–078
USPC .......................................................... 438/98
See application file for complete search history.

(56) References Cited

U.S. PATENT DOCUMENTS

| 4,141,811 | A | 2/1979 | Yerkes et al. | |
|---|---|---|---|---|
| 4,249,957 | A | 2/1981 | Daud et al. | |
| 4,891,325 | A | 1/1990 | Hezel et al. | |
| 5,317,432 | A * | 5/1994 | Ino .................................. | 349/39 |
| 5,376,234 | A | 12/1994 | Yanagida | |
| 5,688,415 | A | 11/1997 | Bollinger et al. | |
| 5,981,398 | A * | 11/1999 | Tsai et al. ...................... | 438/710 |
| 6,060,400 | A | 5/2000 | Oehrlein et al. | |
| 6,147,297 | A | 11/2000 | Wettling et al. | |
| 6,235,214 | B1 * | 5/2001 | Deshmukh et al. ............. | 216/67 |
| 2001/0008227 | A1 | 7/2001 | Sadamoto et al. | |
| 2003/0001134 | A1 | 1/2003 | Sekiya et al. | |
| 2006/0027249 | A1 | 2/2006 | Johnson et al. | |
| 2006/0119548 | A1 * | 6/2006 | Lan et al. ........................ | 345/76 |
| 2006/0183055 | A1 * | 8/2006 | O'Neill et al. ............... | 430/316 |
| 2006/0286774 | A1 | 12/2006 | Singh et al. | |
| 2007/0128761 | A1 * | 6/2007 | Owada et al. ................... | 438/98 |
| 2007/0212510 | A1 * | 9/2007 | Hieslmair et al. ........... | 428/40.1 |
| 2007/0218204 | A1 * | 9/2007 | Garg et al. ............... | 427/255.11 |
| 2008/0085604 | A1 | 4/2008 | Hoshino et al. | |
| 2008/0305643 | A1 | 12/2008 | Heintze et al. | |
| 2009/0050884 | A1 * | 2/2009 | Ye .................................... | 257/43 |

FOREIGN PATENT DOCUMENTS

| EP | 0259572 | A2 | 3/1988 |
|---|---|---|---|
| EP | 0411530 | A2 | 2/1991 |
| EP | 0542148 | A1 | 5/1993 |
| JP | 9102625 | A2 | 4/1997 |
| JP | 2000012517 | A | 1/2000 |
| JP | 2001028362 | A | 1/2001 |
| JP | 2002076404 | A | 3/2002 |
| JP | 2002329710 | A | 11/2002 |
| JP | 2002353484 | A | 12/2002 |
| JP | 2003101051 | A | 4/2003 |
| JP | 2003197940 | A | 7/2003 |
| JP | 2003347660 | A | 12/2003 |
| JP | 2006332509 | A | 12/2006 |
| JP | 2007294642 | A | 11/2007 |
| RU | 2065226 | C1 | 8/1996 |
| RU | 2250536 | C1 | 4/2005 |
| RU | 2301477 | C1 | 6/2007 |

(Continued)

OTHER PUBLICATIONS

Leonel R Arana, Nuria de Mas, Raymond Schmidt, Leksander J Franz, Martin A Schmidt and Klays F Jensen, "Isotropic etching of silicon in fluorine gas for MEMS micromachining", Journal of MIcromechanics and Microengineering, 17 (Jan. 25, 2007), pp. 384-392.*
Rentsch, J., et al—"Industrial realization of dry plasma etching for psg removal and rear side emitter etching", 2007, 22nd European Photovoltaic Solar Energy Conference & Exhibition; pp. 1340-1343; XP 002535054; 4 pgs.
Tucci, M.—et al—"Dry NF3/O2 Plasma Texturing of Multi-Crystal Silicon", 21st European Photovoltaic Solar Energy Conference, 2006, XP 007909059; pp. 1250-1253; 4 pgs.
Perrin, Jerome, et al—"Mass Spectrometric Study of NF3 Plasma Etching of Silicon", Plasma Chemistry and Plasma Processing, 1990, vol. 10, No. 4, pp. 571-587; 17 pgs.
Loper, G. L., et al—"UV laser-generated fluorine atom etching of polycrystalline Si, Mo and Ti", Applied Physics Letters, 1985, vol. 46, Issue 7, p. 654-656; 4 pgs.
Holland, R.J., et a;—"Thermal & Photochemical Promotion of Silicon & Silicon Dioxide by Carbonyl Difluoride", Journal of Applied Physics, 1986, vol. 60, Issue 7, pp. 2553-2557; 6 pgs.

(Continued)

Primary Examiner — Cuong B Nguyen

(57) ABSTRACT

Solar cells are manufactured from P-type doped monocrystalline or polycrystalline silicon ingots by sawing wafers and applying an N-type doping. The wafers can be improved by etching them, especially in a plasma assisted process, with fluorine, carbonyl fluoride, $SF_6$ or $NF_3$. Hereby, the surface is roughened so that the degree of light reflection is reduced, cracks caused from the sawing operation are prevented from proliferation, and glass-like phosphorus-containing oxide coatings caused by phosphorus doping are removed.

8 Claims, No Drawings

(56) References Cited

FOREIGN PATENT DOCUMENTS

| WO | WO 9701189 A1 | 1/1997 |
| --- | --- | --- |
| WO | WO 9934429 A1 | 7/1999 |
| WO | WO 0223608 A1 | 3/2002 |
| WO | WO 2006004224 A1 | 1/2006 |
| WO | WO 2006133695 A1 | 12/2006 |
| WO | WO 2007049347 A1 | 5/2007 |
| WO | WO 2007116033 A1 | 10/2007 |
| WO | WO 2008043827 A2 | 4/2008 |
| WO | WO 2009080615 A2 | 7/2009 |
| WO | WO 2011032983 A2 | 3/2011 |
| WO | WO 2011051251 A1 | 5/2011 |
| WO | WO 2011051409 A1 | 5/2011 |
| WO | WO 2011051410 A1 | 5/2011 |

OTHER PUBLICATIONS

Loper, G.L., et al—"Fluorine atom production mechanisms from COF2 and NF3 in UV laser", 1987, Photon, Beam, and Plasma Stimulated Chemical Processes at Surfaces Symposium held in Boston, Massachusetts, U.S.A., Mat. Res. Soc. Symp. Proc., vol. 75, Materials Research Society, pp. 385-393; 9 pgs.

Loper, G. L., et al—"Mechanistic aspects of argon fluoride laser etching of Si and Mo with F atom precursors COF2 and NF3", Proceedings—Electrochemical Society, 1988, vol. 88, Issue No. 10, pp. 130-142; 14 pgs.

Conte, G., et al—"The Origin of Macroscopic and Microscopic Defects in a-Si1-xGex:H Alloys for Photovoltaic Applications", 1988, Eighth E.C. Photovoltaic Solar Energy Conference. Proceedings of the International Conference (EUR 11780), pp. 701-705; vol. 1 of 2 volumes; 6 pgs.

Jones, Gregory T., et al—"Automated Array Assembly Task In-depth Study of Silicon Wafer Surface Texturizing", Science Tech. Aerosp. Report, Department of Energy / Jet Propulsion Lab. Contract No. 955266, Jul. 1979, N80-19618; 72 pgs.

Walther, G. , et al—"COF2 as Environmentally Friend Plasma Process Gas for the Solar Industry", 2008, Secon, 23rd European Photovoltaic Solar Energy Conference & Exhibition, Sep. 2008; 3 pgs.

Rentsch, J., et al—"Plasma etching for industrial in-line processing of c-Si solar cells", Institute of Electrical and Electronics Engineers—IEEE-: Proceedings of 3rd World Conference on Photovoltaic Energy Conversion, May 18, 2003; Joint conference of 13th PV Science & Engineering Conference, 30th IEEE PV Specialists Conference, 18th European PV Solar Energy Conference ; Osaka International Congress Center "Grand Cube", Osaka, Japan, vol. 2, pp. 1376-1379; 4 pgs.

Perrin, Jerome—Section 3.2.2 "Neutral molecule chemistry in etching", p. 411-412, in "Plasma Processing of Semiconductors", edited by P. F. Williams, Kluwer Academic Publishers,1997; 7 pgs.

Nositschka, W. A., et al—"Dry PSG etching for multicrystalline silicon solar cells", Photovoltaic Energy Conversion, 2003, Institute of Electrical and Electronics Engineers—IEEE, Proceedings of 3rd World Conference on Photovoltaic Energy Conversion, May 18, 2003, vol. 2, pp. 1348-1351, XP-002535055; 4 pgs.

Nositschka, W.A., et al—"Texturisation of multicrystalline silicon solar cells by RIE and plasma etching", Solar Energy Materials and Solar Cells, 2003, vol. 80, Issue 2, pp. 227-237, 11 pgs.

Kastenmeier, B. E. E., et al—"Gas utilization in remote plasma cleaning and stripping applications", Sep./Oct. 2000, J. Vacuum Sci. Technol. A., vol. 18, Issue 5, pp. 2102-2107; 6 pgs.

Walther, G.—"Plasma Etching Technology", presentation, Secon Semiconductor Equipment GmbH, May 2007; Austria; 20 pgs.

U.S. Appl. No. 12/296,139, Anya Pischtiak, et al, filed Oct. 6, 2008.
U.S. Appl. No. 12/808,718, Marcello Riva, filed Jun. 17, 2010.
U.S. Appl. No. 13/496,498, Marcello Riva et al, filed Mar. 16, 2012.
U.S. Appl. No. 13/504,096, Marcello Riva et al, filed Apr. 25, 2012.

\* cited by examiner

PROCESS FOR THE MANUFACTURE OF SOLAR CELLS

CROSS REFERENCE TO RELATED APPLIACTIONS

This application is a U.S. national stage application under 35 U.S.C. § 371 of International Application No. PCT/EP2008/055173 filed Apr. 28, 2008, which claims benefit of U.S. provisional patent application number 61/022958 filed on Jan. 23,2008 the complete content of which is incorporated herein by reference.

The present invention relates to a process for the manufacture of solar cells. In another aspect of the present invention, the invention concerns a process for the production of flat panels.

Solar cells are applied to convert solar light into electric current. They are usually manufactured from monocrystalline blocks of boron-doped silicon (P-type doping) or from cast silicon ingots (polycrystalline silicon, P-type doped with boron) by sawing wafers in desired size out of the bulk material. Then, a layer of silicon doped with phosphorous is formed to provide an N-type doped coating. For example, the wafer can be contacted with $POCl_3$. Contact electrodes are then applied, e.g. by evaporating metal onto the surface of the cell. Several respective solar cells are then arranged to form a solar panel. If desired, the cell may also contain other dopants, e.g. copper, as described by U.S. Pat. No. 4,249,957.

Cells manufactured in this manner still may have some drawbacks. For example, the surface ought to be non-reflective because light is then better absorbed. The wafers may have cracks from the sawing process. During phosphorous doping, a phosphorus-containing glass-like layer may form which is undesired. This is described by J. Rentsch, D. Decker, M. Hofmann, H. Schlemm, K. Roth and R. Preu, in a paper titled "Industrial realization of dry plasma etching for PSG removal and rear side emitter etching", presented at the $22^{nd}$ European Photovoltaic Solar Energy Conference and Exhibition, 3-7 September in Milan, Italy. In this paper, it is described that wet etching phosphorus silicate glass (called "PSG" in the paper) is characterized by high water and chemical waste disposal as well as high mechanical impact. It is further mentioned that PFCs (perfluorocarbons) and $SF_6$ are commonly used for saw damage removal as well as oxide etching during solar cell processing. In experiments, PSG were etched using $CF_4$ (a perfluorocarbon) and hydrogen were used. Other plasma treatments of the wafer are performed using $SF_6$. PFCs and $SF_6$ are considered to have a certain GWP.

The present invention provides a solution to these and other problems.

According to the present invention, solar cells are manufactured from a silicon wafer comprising a step of etching the wafer with an etching gas comprising carbonyl fluoride, fluorine, or nitrogen trifluoride or mixtures thereof.

Carbonyl fluoride and fluorine are preferred because they have no impact on the ozone layer and no GWP. Carbonyl fluoride can be prepared, for example, by photochemical oxidation of $CHF_3$, by reaction of CO with elemental fluorine or by chlorine-fluorine exchange of $COCl_2$ with fluorinating agents.

If desired, certain amounts of known etching agents can be added, e.g. $SF_6$, saturated or unsaturated hydrofluorocarbons, e.g. $CHF_3$, saturated or unsaturated perfluorocarbons, e.g. $CF_4$ or $C_2F_6$, or saturated or unsaturated perfluoroethers. If such additional etchants are applied, they are preferably comprised in an amount of equal to or more than 0.1% by weight and equal to or less than 15% by weight. It is preferred that neither $SF_6$, $NF_3$, hydrofluorocarbons, perfluorocarbons, perfluoroethers or other etchants are comprised which have a negative effect on the ozone layer, or which have a $GWP_{100}$ of more than 15. It is especially preferred that no additional etchant is contained.

The silicon wafer is preferably cut (by sawing) from a P-type doped (especially boron doped) polycrystalline or monocrystalline silicon block.

The treatment of the present invention is preferably performed by a plasma-assisted treatment in a plasma reactor. Such plasma reactors are generally known and are commercially available, e.g. from Applied Materials, Inc., or Secon Semiconductor Equipment GmbH, Austria.

If fluorine is used as treatment gas, it can be used neat. For safety reasons, it is preferably applied in admixture with nitrogen, helium and/or argon. The mixture can be formed in the reactor, or a mixture of fluorine and the inert gas or gases is formed before introducing it into the reactor. If the gases are introduced in such a premixed form into the reactor, a homogenous or near-homogenous mixture can be provided throughout the reactor chamber. In general, the fluorine content of the mixture is, for safety reasons, preferably between 1 and 35% by volume. For example, a mixture of $F_2$ and the inert gas can be supplied from pressurized bottles. In such pressurized bottles, a homogenous mixture forms. It is also possible to introduce the gas constituents separately into the reactor. In the detailed explanation given below, the term "mixture" denotes premixed gas mixtures as well as mixtures created in the plasma reactor.

If safety reasons are of no concern, neat $F_2$ or $F_2$ diluted by lower amounts of nitrogen or argon can be applied, e.g. mixtures comprising 0.1 to 20% by volume of nitrogen or argon.

Mixtures comprising fluorine and nitrogen and mixtures comprising fluorine and argon are preferably applied, and, especially preferably, mixtures comprising fluorine, nitrogen and argon.

In the following, some mixtures are presented which comprise a comparably low content of fluorine. These mixtures are technically very suitable, and are advantageous especially for safety reasons.

If mixtures comprising only fluorine and nitrogen are applied, the content of fluorine preferably is equal to or greater than 1% by volume. The content of fluorine is preferably equal to or lower than 25% by volume. The content of nitrogen is preferably equal to or lower than 99% by volume. Preferably, it is equal to or greater than 75% by volume. In an especially preferred embodiment, the content of fluorine lies in the range of 18 to 22% by volume.

If mixtures comprising fluorine and argon are applied, the content of argon preferably is equal to or greater than 50% by volume. Preferably, it is equal to or lower than 99% by volume. The content of fluorine is preferably equal to or greater than 1% by volume. Preferably, it is equal to or lower than 50% by volume, especially equal to or lower than 25% by volume.

If mixtures comprising fluorine, nitrogen and argon are applied, the content of fluorine is preferably equal to or greater than 1% by volume. It is preferably equal to or lower than 25% by volume. The content of argon is preferably equal to or greater than 4% by volume. Preferably, the content of argon is equal to or lower than 25% by volume. The content of nitrogen is preferably equal to or greater than 4% by volume. It is preferably equal to or lower than 75% by volume.

The sum of fluorine and argon preferably is equal to or lower than 50% by volume, especially preferably equal to or lower than 45% by volume. It is preferably equal to or higher than 25% by volume.

In the mixtures described above, the fluorine content is comparably low for safety reasons. In cases where safety reasons are of no concern, the fluorine content may be higher. Generally, the fluorine content can be equal to or greater than 25% by volume. Preferably, it is equal to or greater than 60% by volume; more preferably, it is equal to or greater than 75% by volume. The remainder to 100% by volume may be constituted by nitrogen and especially by argon which, as said above, sometimes stabilizes the plasma, especially in apparatus with lower power output. If desired, even neat fluorine could be applied. Higher fluorine content and respective lower argon content is also very suitable for plasma apparatus with high power output. The etching reaction is faster with higher fluorine content. For example, mixtures containing 85 to 98% by volume of fluorine and 2 to 15% by volume of argon provide a very fast etching process.

Carbonyl fluoride can be applied as neat substance or in admixture with oxygen and/or inert gases, for example, it can be applied together with nitrogen, helium and/or argon. It is preferably applied as neat substance or admixed with oxygen.

Especially in apparatus with high power plasma, it is often possible to use neat carbonyl fluoride. In plasma apparatus with lower plasma power, it may be advisable to apply mixtures of carbonyl fluoride and argon (optionally together with nitrogen) because argon has a positive effect, e.g. in stabilizing the plasma. Carbonyl fluoride diluted with nitrogen, helium and/or argon also may allow safer handling. For example, carbonyl fluoride is contained in an amount of equal to or more than 50% by volume, preferably equal to or more than 75% by volume. The remainder to 100% by volume is constituted by oxygen, nitrogen, helium and/or argon. Mixtures consisting of carbonyl fluoride (preferably with a carbonyl fluoride content as given above) and argon are especially suitable.

The process according to the invention can be used to etch the photomask of PERL ("passivated emitter and rear, locally diffused") solar cells during the texturation of the emitter. In a PERL cell, two photo mask steps are necessary: an etching step to produce the rib-like surface texture and a local diffusion step to apply the deep n++diffusion regions over which the metal contact bridges are arranged. In a third step, the surface is then coated with a $n^+$ diffusion layer. Details are described in WO 1997/001189. Carbonyl fluoride, $NF_3$ or fluorine can be used here to etch the photomask. The etch process of the present invention can also be used to etch the parasitic emitter on the rear of the solar cell.

According to one embodiment, the surface of the wafer used for the solar cell is modified (it is assumed that it is roughened) by the etching process of the present invention. Roughening of the wafer surface by etching reduces the reflectivity and thus enhances the effectivity of the solar cell. Reflectivity is considered reduced if the total hemispherical reflectivity (averaged over all wavelengths) expressed by the intensity of incident light divided by reflected light is smaller for the surface-treated silicon wafer in relation to the untreated silicon wafer.

The etching treatment is performed for a time which is sufficient to provide the desired reduction of reflectivity. Preferably, the treatment is performed for equal to or more than 1 second. Preferably, the treatment is performed for equal to or less than 10 minutes, preferably for equal to or less than 5 minutes. Etching is preferably performed until about equal to or more than 0.1 μm of the surface are etched away. Preferably, it is performed until equal to or less than 500 μm, preferably, until equal to or less than 100 μm are etched away from the surface, especially until equal to or less than 20 μm are etched away. Often, a few μm are etched away, for example equal to or less than 10 or even equal to or less than 5 μm.

The etching can also be applied to the rear side of the solar cell to improve adhesion of the electrodes which are applied, as is described below.

The etching treatment can also be performed to treat silicon wafers which have cracks. Isotropic etching is very advantageous. Often, as a result of cutting the wafers from silicon blocks, cracks form. Often, these cracks get larger and larger, and thus, wafers become waste material. A plasma etching treatment of the wafers with $COF_2$ or $F_2$ transforms the sharp-angled crack into a keyhole-like structure. The broader end of the crack corresponds to the opening of a key hole taking up the key bit, while the sharp angle of the crack is transformed into a rounded whole which, if it were a keyhole of a mechanical lock, would receive or take up the key shaft. Such a keyhole-like structure does not tend to expand further, and the wafer is suitable for further use. The transformation of the sharp-angled structure of the crack into a keyhole-like structure thus prevents propagation of the crack.

Also for treatment of cracks, fluorine gas or fluorine gas in mixture with oxygen and/or inert gases, especially nitrogen, helium and/or argon, as described above, can be used. Preferably, carbonyl fluoride is applied. Carbonyl fluoride can be applied as neat substance, or it can be applied together with oxygen, nitrogen, helium and/or argon as indicated above. The latter mixtures offer some advantages in view of safe handling. As mentioned above, in apparatus with lower power output, it may be advantageous to apply carbonyl fluoride admixed with argon, for plasma stabilization. For this field of application, gas mixtures can be applied like those described above for surface roughening. Oxygen improves etching.

In another embodiment, wafers are treated which have a glasslike phosphorus-silica coating. Such coatings may be the undesired result during the step of doping the silicon wafer with phosphorus compounds to achieve the N-type doping. This glasslike coating reduces the electric contact of the electrode which is applied on the surface of the cell. It was found that this glass-like coating can be removed by treating it in a plasma with carbonyl fluoride or fluorine or gas mixtures like those described above which contain fluorine or carbonyl fluoride together with oxygen, nitrogen, helium and/or argon.

The plasma-induced etching treatment is performed at reduced pressure. Pressure is given in the following in absolute values. Preferably, the pressure is equal to or higher than 0.1 mbar. Preferably, it is equal to or lower than 100 mbar. Especially preferably, it is equal to or lower than 50 mbar.

During plasma-induced etching treatment, the wafer heats up. So, if needed, either the wafer must be cooled if a threat of overheating it exists, or the treatment must be interrupted from time to time so that the wafer cools.

The gases leaving the plasma reactor comprise unreacted etchant, HF, $SiF_4$, phosphorous fluorides and other reaction products. They can be washed with water, especially alkaline water, to remove any HF, carbonyl fluoride, $SiF_4$ or fluorine. Any oxygen, nitrogen, helium or argon passing the washer can be recovered or passed to the environment. The simple removal of HF, carbonyl fluoride and fluorine in alkaline water or by other well-known methods compared with other etching gases is a further advantage.

The wafers treated according to the process of the present invention are then further treated to produce a solar cell. Especially, contact electrodes are applied. These contact electrodes are needed to withdraw electric current (usually direct current) from the cell. A preferred way to apply contact electrodes is evaporating metal onto the wafer as mentioned in U.S. Pat. No. 4,249,957. A contact electrode from titanium-palladium-silver is very suitable. There are alternative methods which can be used to apply contact electrodes. For example, a paste can be applied which contains conductive particles, e.g. silver particles, to form a pattern on the wafer, the wafer is fired, and a conductive pattern is formed on the wafer which functions as electrode. This alternative is described in EP-A-0 542148.

Another aspect of the present invention is a solar cell obtained by the process of the present invention. In one embodiment, cells containing a wafer which was surface-etched have a very low degree of reflexivity. In another embodiment, the solar cells contain cracks in keyhole-like form. In a third embodiment, the solar cells have both properties. The invention also concerns a solar panel obtained by assembling a plurality of solar cells obtained in the process of the present invention. "A plurality" denotes at least two solar cells. The upper limit is given from practical reasons. Preferably, equal to or less than 10 solar cells, more preferably, at least 20 solar cells are assembled to provide a solar panel.

The advantage of the present invention is that aqueous etching is substituted by a fast, clean method. The additional advantage of carbonyl fluoride and fluorine is that they are not ozone depleting, have a low greenhouse gas potential, if at all, and can be removed easily from any vents leaving the reactor.

It further was found that carbonyl fluoride is a suitable etchant for the manufacture of flat panels.

It is known that circuit patterns are formed on flat panels displays using plasma assisted chemical etching to pattern the thin film transistors used to switch the liquid crystal polarizing elements in often used "active matrix liquid crystal displays". It is desired to achieve a uniform or controllably non-uniform etch depth over the area of the display. For example, as described in U.S. Pat. No. 5,688,415, an overlying film is provided on a flat panel, especially large flat panel display substrate with a photolithographic mask overlying the film and having a predetermined pattern of openings therethrough. The substrate is then placed adjacent a plasma etching tool with a projected area which is smaller than the area of the surface of the substrate. The etching tool is scanned across the surface of the substrate to transfer the pattern of the photolithographic mask into the film on the surface thereof. Thereafter, the mask is removed from the surface of the overlying film. The substrate may be glass and the film amorphous or polycrystalline silicon.

In processes performed to manufacture flat panel display, such as the process described above, carbonyl fluoride can be used as etching gas. Carbonyl fluoride can be applied as neat substance or in admixture with inert gases, for example, it can be applied together with oxygen, nitrogen, helium and/or argon. It is preferably applied as neat substance. These gas mixtures can also be used for plasma chamber cleaning.

Especially in apparatus with high power plasma, it is often possible to use neat carbonyl fluoride. In plasma apparatus with lower plasma power, it may be advisable to apply mixtures of carbonyl fluoride and argon (optionally together with nitrogen) because argon has a positive effect, e.g. in stabilizing the plasma. Carbonyl fluoride diluted with oxygen, nitrogen, helium and/or argon also may allow safer handling. For example, carbonyl fluoride is contained in an amount of equal to or more than 50% by volume, preferably equal to or more than 75% by volume. The remainder to 100% by volume is constituted by oxygen, nitrogen, helium and/or argon. Mixtures consisting of carbonyl fluoride (preferably with a carbonyl fluoride content as given above) and argon and optionally oxygen are especially suitable.

The following examples are intended to explain the invention further without intending to limit it.

EXAMPLES

General: 200 mm plain silicon wafers without structure were etched in a microwave plasma etcher manufactured by Secon Semiconductor Equipment GmbH, Austria. The wafers are weighed before and after etching, the difference in weight indicates the etch rate. In absence of a water cooled chuck, the etch time was restricted to several times 10 minutes with 3 minutes intervals for cooling down. Examples 1 and 4 are comparison examples.

1. Test results

| | weight [g] | | Δ weight [g] after | | flow [sccm] | | | flow | p | comment |
|---|---|---|---|---|---|---|---|---|---|---|
| | before | after | 25 min | 100 min | $SF_6$ | $COF_2$ | $N_2O$ | Ar | [mbar] | min poss p |
| 1 | 48.44 | 40.48 | | 7.96 | 200 | 0 | 0 | Y | 1 | |
| 2 | 40.48 | 35.94 | | 4.54 | 0 | 400 | 0 | Y | 1 | |
| 3 | 35.94 | 34.35 | 1.59 (50 min) | 3.18 | 0 | 400 | 50 | Y | 1 | |
| 4 | 34.35 | 30.39 | 3.96 (50 min) | 7.92 | 200 | 0 | 50 | Y | 1 | |
| 5 | 30.38 | 29.06 | 1.32 | 5.28 | 0 | 800 | 0 | Y | 1.1 | |
| 6 | 29.06 | 27.36 | 1.70 | 6.80 | 0 | 800 | 0 | N | 1.0 | |
| 7 | 27.36 | 25.90 | 1.46 | 5.84 | 0 | 800 | 0 | N | 1.5 | |
| 8 | 25.90 | 24.10 | 1.80 | 7.20 | 0 | 600 | 0 | N | 0.73 | min poss p |
| 9 | 24.10 | 22.39 | 1.71 | 6.84 | 0 | 600 | 0 | Y | 0.80 | |
| 10 | 22.39 | 20.54 | 1.85 | 7.40 | 0 | 600 | 0 | N | 0.73 | |

Ar is used for improving homogeneity of plasma over the length of microwave rods. It has no impact on Si etching reaction. Y/N indicates if it was switched on or off.

Flow same MFC (mass flow controller) was used for $SF_6$ and $COF_2$. The MFC was calibrated for $SF_6$. For $COF_2$ a conversion factor of 2 (O, 544/0,27) had to be used.

The tests show that carbonyl fluoride can be successfully applied for etching the surface of silicon wafers etching time could be shortened while still obtaining a non-reflective wafer.

Example 2

Treating Silicon Wafer for Rendering Cracks Harmless

A boron-doped silicon wafer sawn out of a polycrystalline silicon block has cracks at the edge. The wafer is transferred into a plasma chamber. The chamber is evacuated, and carbonyl fluoride is introduced into the chamber up to a pressure of 0.4 mbar, and the plasma is started. During the plasma treatment the initially sharp-angled crack is transformed into a keyhole-like structure which will not proliferate; this, the wafer is no longer useless, but can be used for further treatment to obtain a solar cell (doping with phosphorus, attaching electrodes etc).

Example 3

Removal of a P-Containing Glass-Like Coating

A boron-doped silicon wafer is contacted with $POCl_3$ and heated to between 960 and 1000° C. to convert the phosphorus compound into $P_2O_5$. As a side reaction, phosphorus-silica glass-like coating is formed. To remove this glass-like coating, the wafer is positioned in a plasma treatment chamber, the chamber is evacuated, and neat carbonyl fluoride is introduced into the reactor until a pressure of 0.4 mbar is achieved. Then, the plasma is started. The process is stopped as soon as the glass-like coating is etched away.

Example 4

Removal of a P-Containing Glass-Like Coating Using Fluorine

Example 4 is repeated, but this time, a mixture consisting of 20% by volume fluorine, 10% by volume of nitrogen and 70% by volume of argon is applied. The glass-like coating is etched away.

Example 5

Applying Electrodes to the Treated Wafer

A wafer etched with neat carbonyl fluoride to make it less reflective is further treated to apply electrodes as described in EP-A-0 542148. A paste containing silver and, as inorganic binder, lead oxide and silicon dioxide is applied on the front side of the wafer by screen printing according to the desired pattern of the electrode structure. On the back side, a similar electrode paste is applied which further contains aluminium. The wafer is then fired at around 800° C. The pattern is then galvanized in a bath containing silver chloride and sodium thiosulfate. This done as described especially on page 3, line 53 to page 5, line 23.

Example 6

Manufacture of Silicon Transistors on a Flat Panel Display

Silicon transistors are formed on large flat panel displays as described in U.S. Pat. No. 5,688,415, in line 60 of column 5 to line 4 in column 9. A glass substrate is provided with an overlying film of one or more transparent electrode materials, e.g. indium tin oxide or silicon oxide. A photoresist overlies the coating and has predetermined openings. The substrate is brought into a plasma chamber, and the pattern of the photolithographic mask is transferred by scanning to the film on the glass substrate. In a later step, etching is performed. In this step, a mixture of 60% by weight of carbonyl fluoride and 40% by weight of argon is applied. The plasma dwell-time version position map is generated using computation hardware and suitable software to prevent overetching.

The invention claimed is:

1. A method for manufacturing a solar cell from a silicon wafer having a phosphorus-containing glass-like coating, comprising a step of etching the silicon wafer to roughen the surface of said silicon wafer and to remove the phosphorus-containing glass-like coating with a mixture of only $F_2$ and nitrogen used as an etching gas; wherein the content of fluorine is from 1% by volume to 22% by volume.

2. The method according to claim 1 wherein the silicon wafer is monocrystalline.

3. The method according to claim 1 wherein the silicon wafer is polycrystalline.

4. The method according to claim 1 wherein the silicon wafer is P-type doped with N-type doped coating.

5. The method according to claim 1 wherein the silicon wafer having at least one crack is etched.

6. The method according to claim 1, wherein etching is assisted by remote plasma.

7. The method according to claim 1 wherein contact electrodes are applied to the silicon wafer after etching.

8. The method according to claim 1 wherein two or more of the solar cells manufactured by said method are assembled to manufacture a solar panel.

* * * * *